United States Patent
Prindiville et al.

(10) Patent No.: US 6,548,764 B1
(45) Date of Patent: Apr. 15, 2003

(54) SEMICONDUCTOR PACKAGES AND METHODS FOR MAKING THE SAME

(75) Inventors: Casey Prindiville, Nampa, ID (US); Tongbi Jiang, Boise, ID (US); Bret Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/590,023

(22) Filed: Jun. 7, 2000

(51) Int. Cl.[7] ................................................. H05K 1/03
(52) U.S. Cl. ....................................... 174/255; 174/260
(58) Field of Search ............................... 174/52.2, 52.4, 174/260, 255; 29/832, 833, 838, 841

(56) References Cited

U.S. PATENT DOCUMENTS

| | | |
|---|---|---|
| 5,475,918 A | 12/1995 | Kubota et al. |
| 5,696,033 A | 12/1997 | Kinsman |
| 5,715,143 A | 2/1998 | McHugh et al. |
| 5,789,803 A | 8/1998 | Kinsman |
| 5,952,611 A * | 9/1999 | Eng et al. .................. 174/52.4 |
| 5,953,216 A | 9/1999 | Farnsworth et al. |
| 5,998,860 A | 12/1999 | Chan et al. |
| 6,013,535 A | 1/2000 | Moden et al. |
| 6,017,776 A | 1/2000 | Jiang et al. |
| 6,021,563 A | 2/2000 | Heo et al. |
| 6,023,666 A | 2/2000 | Jiang et al. |
| 6,048,755 A | 4/2000 | Jiang et al. |
| 6,060,339 A | 5/2000 | Akram et al. |
| 6,084,311 A | 7/2000 | Jiang et al. |
| 6,091,136 A | 7/2000 | Jiang et al. |
| 6,091,140 A | 7/2000 | Toh et al. |
| 6,098,278 A * | 8/2000 | Vindasius et al. ............. 29/830 |
| 6,110,805 A | 8/2000 | Schrock et al. |
| 6,111,324 A * | 8/2000 | Sheppard et al. ........... 257/787 |
| 6,201,299 B1 | 3/2001 | Tao et al. |
| 6,218,731 B1 | 4/2001 | Huang et al. |
| 6,265,766 B1 | 7/2001 | Moden |
| 6,303,997 B1 | 10/2001 | Lee |
| 6,326,700 B1 | 12/2001 | Bai et al. |
| 6,331,451 B1 | 12/2001 | Fusaro et al. |

* cited by examiner

Primary Examiner—David L. Talbott
Assistant Examiner—Jeremy Norris
(74) Attorney, Agent, or Firm—Klarquist Sparkman, LLP

(57) ABSTRACT

Semiconductor package support elements including cover members attached to one or more reject die sites are provided. Methods for making the support elements of the present invention and for making semiconductor packages using the same are also provided. Reject die sites on defective substrates of a support element are covered prior to the encapsulation process using a cover member. The cover member comprises, for example, pressure-sensitive or temperature-activated tape, reject dies, or the like. The support elements and methods of the present invention virtually eliminate bleeding or flashing during encapsulation due to the presence of reject die sites. The support elements and methods of the present invention further ensure that functional dice are not sacrificed by being attached to reject die sites, thereby decreasing manufacturing costs while increasing yield of functional semiconductor packages.

14 Claims, 5 Drawing Sheets

SEMICONDUCTOR PACKAGES AND METHODS FOR MAKING THE SAME

FIELD OF THE INVENTION

This invention relates generally to semiconductor packages and more specifically to semiconductor package support elements having one or more covered reject die sites and methods for making semiconductor packages from the same.

BACKGROUND OF THE INVENTION

In semiconductor manufacture, a single semiconductor die (or chip) can be packaged within a sealed package. The package protects the die from damage and from contaminants in the surrounding environment. In addition, the package provides a substantial lead system for electrically connecting the integrated circuits on the die to the outside world.

One type of semiconductor package 10 is illustrated in FIG. 1A. The package 10 includes a substrate 12 having a planar die attach surface or die site 22. A semiconductor die 16 is mounted to an upper surface of the substrate 12 on the die site 22. The die 16 is typically adhesively bonded to the substrate 12 with an adhesive layer 34. An encapsulating resin 38 encapsulates the die 16.

In addition to the die site 22 on the upper surface, the substrate 12 includes an opposing conductor surface 24 wherein conductors 18 are formed in a required pattern. A wire bond opening 26 in the substrate 12 provides access for bonding wires 28. The bonding wires 28 are connected to the conductors 18 and to bond pads (not shown) on the die 16. A glob top 40 is formed over the wires 28 for protection.

The semiconductor package 10 also includes an array of solder balls 14. The solder balls 14 are bonded to ball bonding pads 24 on the conductors 18.

As shown in FIG. 1 B, the substrate 12 is initially a segment 32 of a support element 30. The support element 30 includes multiple substrates 12 (and thus multiple die sites 22). The support element is used to fabricate multiple semiconductor packages 10. The support element facilitates the fabrication process in that different operations, such as die attach and wire bonding, can be performed at the same time on each of the substrates. Following the fabrication of the semiconductor packages 10 from the support element 30, the support element is singulated into individual semiconductor packages.

The process for packaging semiconductor dice includes matching a die to each die site on the support element. The die is attached to the die site over the wire bond opening 26 so that the die may be electrically connected to the substrate. Currently available support elements typically include one or more substrates that are defective or non-functional, i.e., the substrates include "reject die sites." Individual substrates of a support element may be non-functional for a variety of reasons, such as faulty electrical circuitry of a substrate. Such defect substrates of the support element cannot be utilized to fabricate a functional semiconductor package but cannot be separated from the support element prior to processing of the other substrates on the support element. If the defective substrates are separated from the support element, such action necessarily limits the number of substrates that may be processed at one time using the separated support element. Thus, physical separation of defect substrates from the support element prior to fabrication of the semiconductor packages is not preferred.

When functional dice are attached to the "reject die sites" of the support element and further are processed, the resulting semiconductor packages are necessarily defective. This sacrifices functional dice, thereby increasing semiconductor package manufacturing costs and decreasing yields. To avoid the added cost (i.e., sacrificing functional dice), a "reject die site" on a support element could simply be skipped or omitted during the die attach process. Regrettably, omitting attachment of a die to a die site on a support element causes problems during the encapsulation process.

During the encapsulation process, liquid encapsulation material flows over and around the attached dice and substrates of the support element. If one or more bonding slots are left open, i.e., a die is not attached to a die site of the support element, the encapsulation material flows through the uncovered opening 26. When the encapsulation material flows through such openings, it contaminates dice adjacent and/or near the uncovered opening. This is known as "bleeding or flashing." The bleeding of encapsulation material produces even more defective semiconductor packages, further increasing manufacturing costs and lowering yield. Moreover, bleeding of the encapsulation material may stick to the mold body and contaminate the next support element processed through the encapsulation machine.

In attempt to avoid (1) sacrificing functional dice by attaching the dice on reject die sites, (2) contaminating adjacent dice and mold bodies by omitting attachment of dice to reject die sites, and (3) processing support elements that include a minimal number of substrates due to prior separation of the defective substrates, the industry pays a premium price for support elements having no reject die sites. This also increases semiconductor package manufacturing costs.

Accordingly, there is a need for a process for making semiconductor packages using support elements having one or more reject die sites without contaminating adjacent dice and without destroying functional dice by attaching the dice to reject die sites. To this end, there is a need for support elements having modified reject die sites to eliminate risk of contamination of adjacent dice on a support element, during encapsulation and to preserve functional dice for use on functional die sites.

SUMMARY OF THE INVENTION

In light of the deficiencies of the prior art, this invention provides semiconductor package support elements including cover members attached to one or more reject die sites. The present invention further provides methods for making the support elements of the present invention and for making semiconductor packages using the same.

According to the present invention, reject die sites on defective substrates of a support element are covered prior to the encapsulation process using a cover member. The cover member comprises, for example, pressure-sensitive or temperature-activated tape, reject dies, or the like. The support elements and methods of the present invention virtually eliminate bleeding or flashing during encapsulation due to the presence of reject die sites. The support elements and methods of the present invention further ensure that functional dice are not sacrificed by being attached to reject die sites, thereby decreasing manufacturing costs while increasing yield of functional semiconductor packages.

DETAILED DESCRIPTION

Figure 1A:
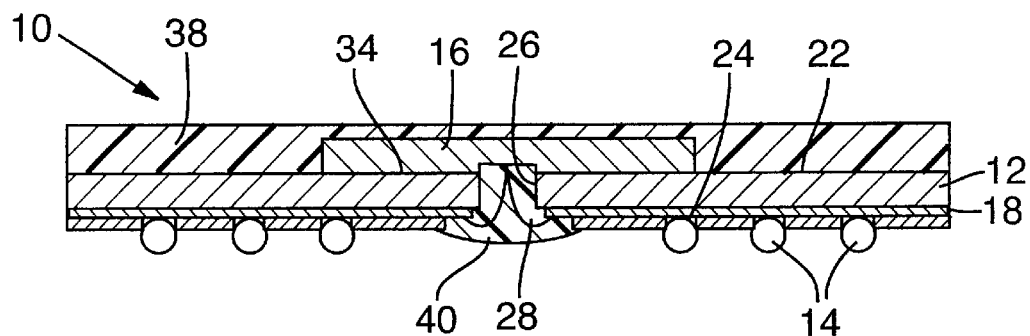
FIG. 1A is a schematic cross-sectional view of a conventional semiconductor package taken along section line 1A—1A of FIG. 1B.
Figure 1B:
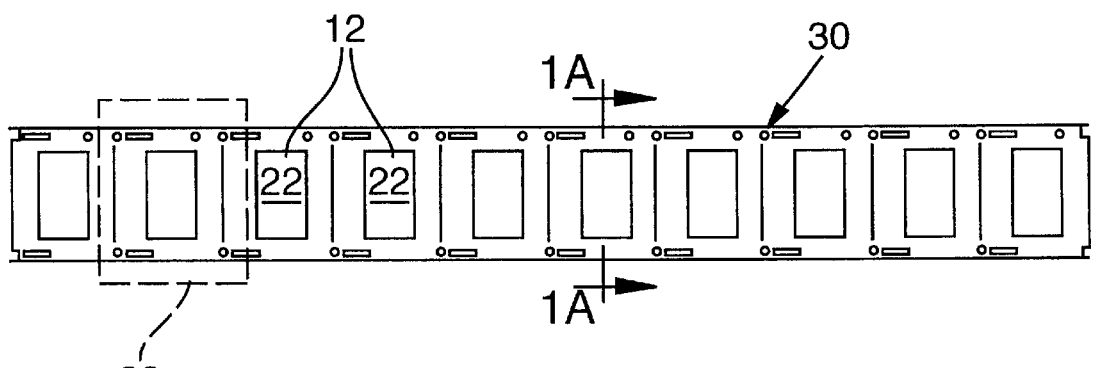
FIG. 1B is a plan view of a conventional support element having a multitude of exposed die sites for fabricating semiconductor packages, such as shown in FIG. 1A.
Figure 2A:
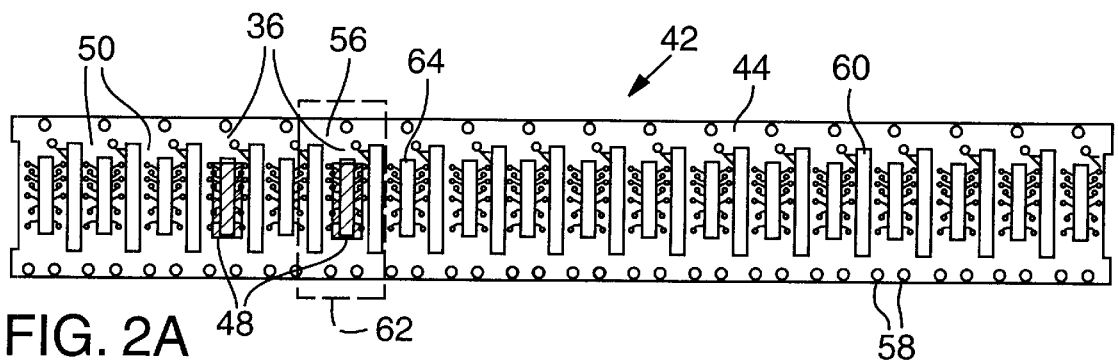
FIG. 2A is a plan view of a support element of the present invention, the support element containing multiple die sites, including covered reject die sites.
Figure 2B:
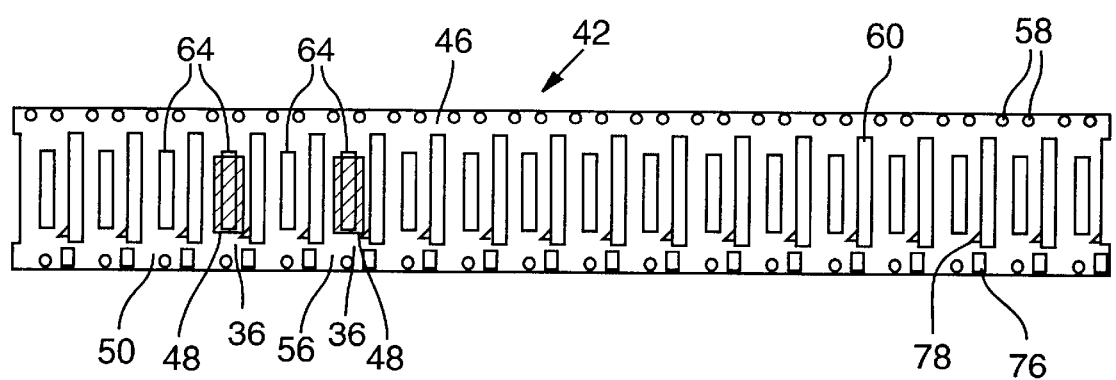
FIG. 2B is a bottom view of the present invention support element as shown in FIG. 2A.
Figure 2C:
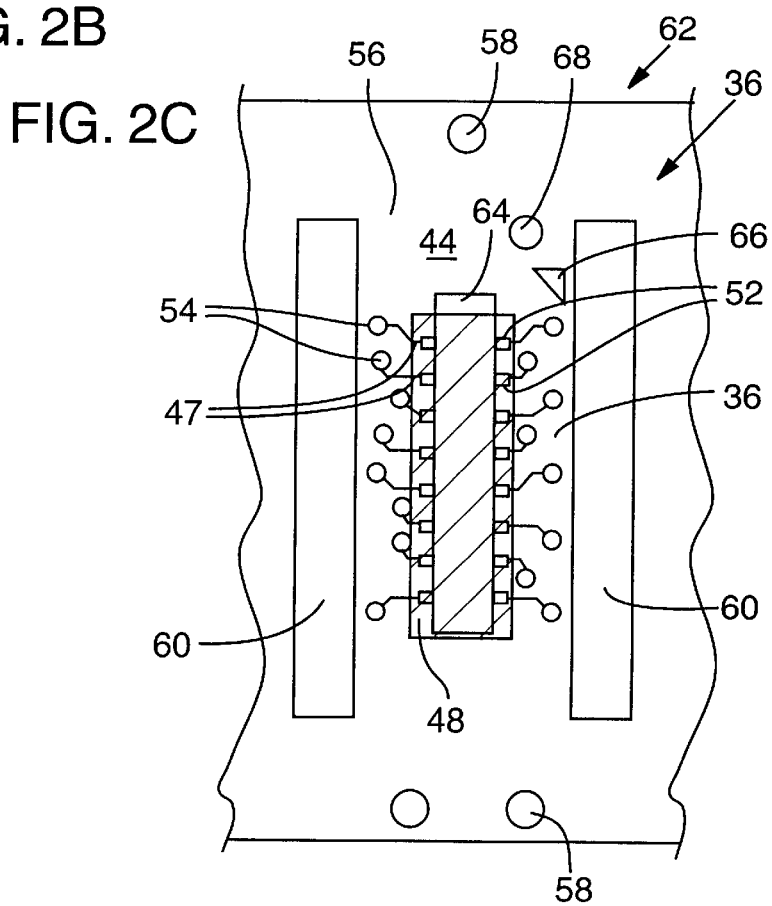
FIGS. 2C–2E are bottom views, of enlarged portions of a covered defective substrate of a support element of the present invention shown in FIG. 2A.
Figure 2D:
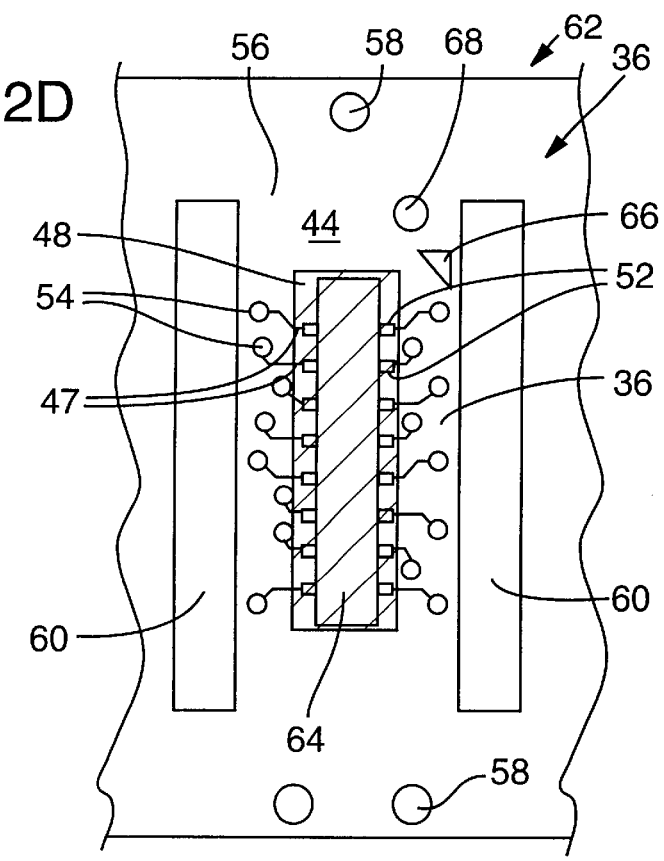
Figure 2E:
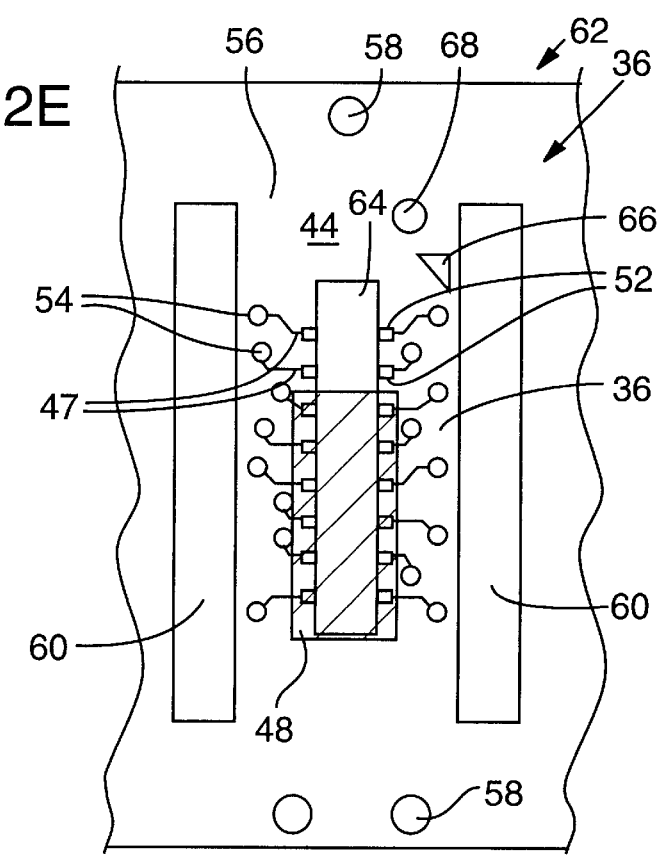
Figure 3A:
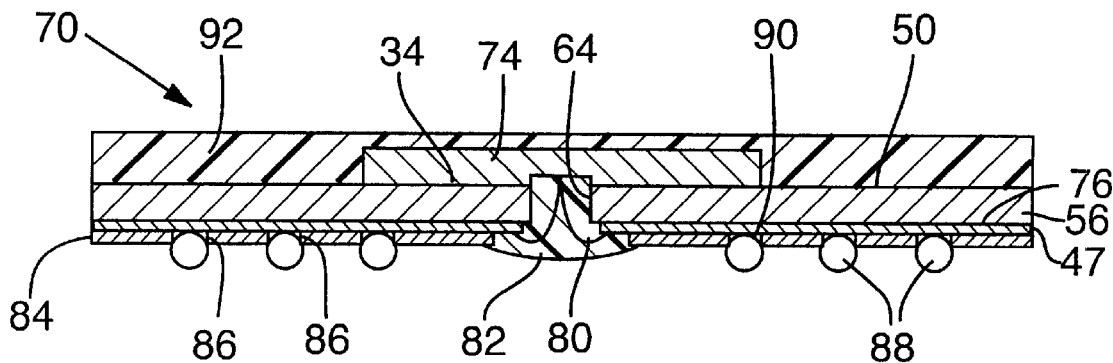
FIG. 3A is a schematic cross-sectional view of a semiconductor package manufactured from a functional substrate of the support element of the present invention.
Figure 3B:
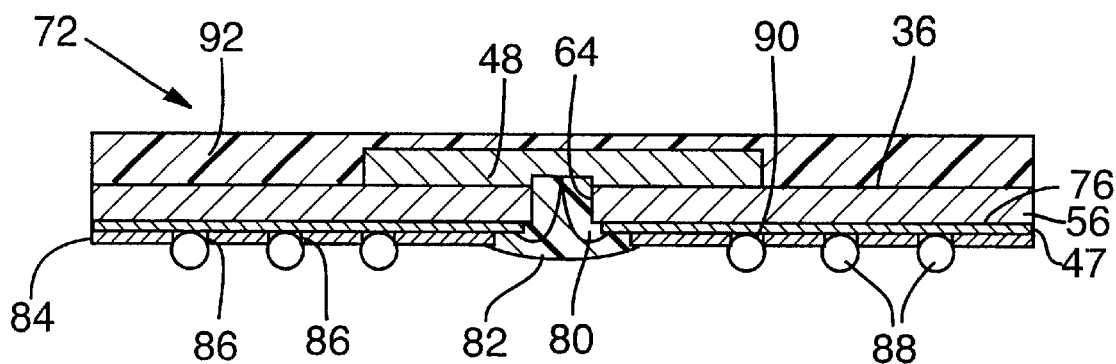
FIG. 3B is a schematic cross-sectional view of a semiconductor package manufactured from a defective substrate of the support element of the present invention.

Generally, the present invention provides semiconductor package support elements 42 (FIGS. 2a and 2B) having one or more covered reject die sites 36 (FIGS. 2A–2E) and methods for making semiconductor packages 70, 72 from the same (FIGS. 3A and 3B).

More specifically, with reference to FIGS. 2A–2C, an embodiment of the support element 42 of the present invention includes multiple substrates 56. Each substrate 56 is a segment of the support element 42 and will subsequently be separated from the adjacent substrates 56 to form a semiconductor package 70 (FIGS. 2A and 3A). In the illustrative embodiment there are 18 substrates 56 on the support element 42 (FIGS. 2A and 2B). However, this number is merely exemplary and the support element 42 may include a fewer or greater number of substrates 56. The substrates 56 are typically positioned side-by-side and are integrally connected. As stated above, the support element 42 facilitates the fabrication process in that different operations, such as die attach and wire bonding, can be performed at the same time on multiple substrates 56.

The substrates 56 of the support element 42 preferably comprise electrically insulating materials, such as organic polymer resins reinforced with glass fibers, metals, epoxy resins (e.g., FR-4 and FR-5), ceramics, and other such materials used in electronic applications. The support element 42 (thus, the substrates 56) is formed to be of desired dimensions as known to those persons skilled in the art (such as a desired thickness of from about 0.2 mm to about 1.6 mm), depending upon the type of semiconductor packages to be formed therefrom.

Each substrate 56 of the support element 42 further includes a first planar surface 44 (FIG. 2A) and a second planar surface 46 (FIG. 2B). In FIG. 2C a single substrate 56 of support element 42 is illustrated in greater detail. Each substrate 56 further includes conductors 47. The conductors 47 are preferably patterned on the first surface 44 of each substrate 56. Conductors 47 preferably comprise a layer of conductive metal, such as copper, titanium, tungsten, gold or nickel.

Each substrate 56 preferably further includes wire bonding pads 52 to facilitate the wire bonding process. Each substrate 56 includes a substantially planar die attach area on the second surface 46 upon which a die 74 (FIG. 3A) is attached to the substrate. The die attach area of each substrate 56 comprises either an "operational" or "functional die site" 50 or a "defective" or "reject die site" 36 (FIGS. 2A and 2B). As discussed above, substrates 56 of a support element may be defective (i.e., the substrate may have a "reject die site" 36) for a variety of reasons, such as faulty electrical circuitry of the substrates.

Each substrate 56 of the support element 42 further includes a wire bond slot 64. The wire bond slot 64 extends from the first surface 44, through the substrate 56 to the second surface 46. Although shown rectangular in shape, wire bond slots 64 may be of any suitable size and shape, as is known to those persons skilled in the art. The wire bond slots 64 provide access for bonding wires 80 (see FIGS. 3A and 3B). The bonding wires 80 connect the die 74 circuitry to the corresponding substrate 56 circuitry (later in the semiconductor package fabrication process).

Each reject die site 36 of the support element 42 includes a cover member 48 (cover members 48 are shown with cross-hatch in FIGS. 2A–2E). The cover member 48 is preferably attached to the reject die site 36 so as to cover from about 70% to about 100% of the corresponding wire bond slot 64 on the die site. Preferred ranges of coverage of the wire bond slot 64 are discussed below with reference to FIGS. 2C–2E. The wire bond slot 64 is covered to prevent contamination through the slot during the encapsulation process. (The support member 42, wire bond slots 64, and die sites 36, 50 are illustrated in FIGS. 2A–2E prior to formation of a solder mask, solder balls or an encapsulation resin 92 that complete formation of the semiconductor packages 70, 72. The semiconductor packages 70, 72 are shown in complete form in FIGS. 3A and 3B.)

Cover member 48 may comprise any sufficiently rigid material that can be adhered to first surface 44 of the support element 42. Of course, cover member 48 preferably will not comprise a material that would contaminate or otherwise negatively impact the operation of a completed semiconductor package 70 (FIG. 3A). The cover member 48 material must be able to withstand encapsulation pressures, typically from about 100 psi to about 1800 psi. For example, in one embodiment of support element 42, cover member 48 comprises pressure-sensitive (preferably one-sided) tape, such as KAPTON™ tape (available from Precision PCB Services, Inc., of Santa Clara, Calif.). In an alternative embodiment of the support element 42, cover member 48 comprises temperature-sensitive tape, such as ABLESTIK™ tape, (SKU No. RP444-14 available from National Starch and Chemical Co., of Bridgewater, N.J.). In yet another embodiment of the support element 42 of the present invention, the cover member 48 comprises a non-functional or reject die.

Cover member 48 is preferably relatively specifically attached to cover A majority of the wire bond slot 64 opening. That is, cover member 48 is attached to cover a sufficient portion of the wire bond slot 64 opening so as to eliminate bleeding or flashing during encapsulation but not so much as to cause a negative pressure zone on the substrate 56 during the encapsulation process.

The percentage of coverage of the wire bond slot 64 with the cover member 48 may vary depending upon the encapsulation material to be used and the width of the wire bond slot 64. Nonetheless, it has been discovered that for most conventional encapsulation materials and convention slot widths, the cover member 48 should cover from about 70% to about 100% of the wire bond slot 64 opening. It has been discovered that when a cover member 48 (comprising tape or other suitable material as discussed above) is attached to a reject die site 36 to completely cover (i.e., cover 100% of)

wire bond slot 64 (as shown in FIG. 2D), a negative pressure on the first surface 44 of the substrate 56 may occur during the encapsulation process. A negative pressure may cause undesirable bending or bowing of the substrate 56 near or at the edges of the wire bond slot 64. It has also been discovered that 100% coverage of the wire bond slot 64 opening may work if the cover member material and the adhesive for attaching the cover member to the substrate 56 are sufficiently strong so as to withstand the encapsulation process pressures. It is possible, however, that with some substrate materials, the substrate 56 is deformed beyond acceptable limitations due to the pressures built up when the wire bond slot 64 is covered completely.

The optimum percentage of coverage of the wire bond slot 64 with the cover member 48 will necessarily depend on the encapsulation material to be used and the wire bond slot 64 width. Nonetheless, it has also been discovered that when a cover member 48 is attached to a reject die site 36 to cover just a major portion of the bonding slot 64 (i.e., from about 70% to about 98% or, more preferably from about 80% to about 95%, and most preferably about 90% coverage of the wire bond slot 64 opening) (see FIG. 2C) encapsulation material bleeding is virtually or completely eliminated. Furthermore, a negative pressure zone at the substrate 56 is not created during encapsulation.

It has also been discovered that when a cover member 48 is attached to a reject die site 36 to cover a minor portion of the bonding slot 64 (i.e., less that about 65% of the wire bond slot 64 opening (see FIG. 2E) bleeding or flashing often occurs. On the other hand, 65% coverage is better than no coverage of the wire bond slot 64 opening. Further, bleeding is most frequently a problem when the encapsulation material enters the solder ball attachment pad area of the semiconductor package 70 (FIG. 3A). Semiconductor packages having smaller pitches and less space between the solder ball attachment pads are more susceptible to contamination from encapsulation bleed than are semiconductor packages having wider pitches or greater spaces between the ball attachment pads.

Each functional die site 50 of support element 42 (during manufacture of the semiconductor package 70, FIG. 3A) will have a die (not shown in FIGS. 2A–2E) attached thereto, to cover wire bond slot 64. The support element 42 illustrated in FIGS. 2A and 2B is shown prior to attachment of a die. Functional or operational die (not shown) are attached to functional die sites 50 only.

As shown in FIG. 2A, the support element 42 of the present invention may also include one or more indexing openings 58 formed through one or more of the substrates 56, proximate longitudinal edges of the support element. The indexing openings 58 permit support element 42 to be handled by automated transfer mechanisms associated with chip bonders, wire bonders, molds, trim machinery, etc. Additionally, support element 42 may include separation openings 60 to facilitate singulation of individual substrates 56 from support element 42 after formation of the semiconductor packages 70, 72 (FIGS. 3A and 3B).

As shown in FIG. 2C, the substrate 56 may also include a triangular material segment 66 to function as a pin # 1 indicator and a circular metal segment 68 to function as an alignment fiducial. Both segments 66, 68 are preferably formed on the first surface 44 of support element 42 at each substrate. The metal segments 66, 68 may comprise the same metal as the conductors 47.

Prior to the die attachment process, defect substrates 12 (and thus reject die sites are detected and marked using conventional methods known to those skilled in the art. Defective substrates 12 are then marked for identification of reject die sites thereon. A simple pen marking on the defective substrates 12 may be used to identify the reject die sites 36. Other methods of marking or identifying defect substrates 12 as known to those skilled in the art may be used to identify the defective substrates 12.

Figure 4:
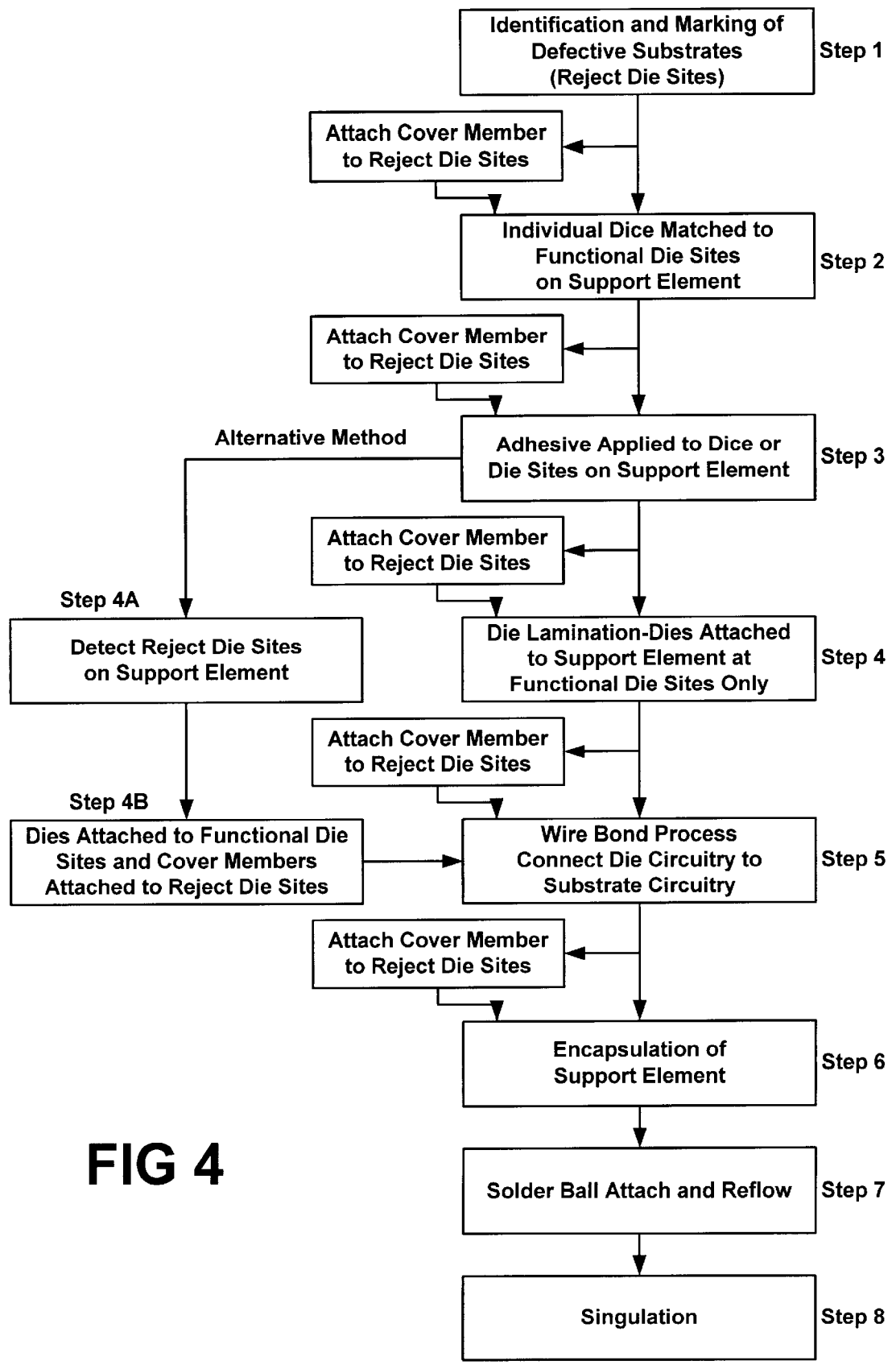
FIG. 4 is a process flow chart illustrating several of the methods of the present invention.

With reference to the process flow chart illustrated in FIG. 4, a cover member 48 may be attached to the reject die sites at a number of different stages during the semiconductor package manufacture process. The cover member 48, however, should be attached prior to the encapsulation process (Step 6 in FIG. 4). For example, according to a first method of the present invention, cover members 48 are attached to reject die sites 36 immediately after identification of the defective substrates 12 (i.e., immediately after Step 1). Alternatively, the cover members 48 of the support element 42 may be attached to reject die sites just prior to the matching of dice to the support element 42 functional die sites 50 (i.e., just prior to Step 2).

According to a second method of the present invention, dice are matched to functional dies sites, i.e., uncovered die sites (Step 2 in FIG. 4) and cover members 48 are then attached to the reject die sites 36.

According to a third method of the present invention, after the dice are matched with functional die sites (Step 2 in FIG. 4), adhesive is applied to all of the die sites (Step 3). Each die is attached to the matched die site on the support element via the adhesive. The adhesive typically comprises an epoxy, acrylic, silicone, or polyimide adhesive material, such as LOC tape, that will be sandwiched between the bottom of the die and the matched die site. Prior to die attachment, during die attachment or just following die attachment, the cover members 48 of the support element 42 are attached to the reject die sites 36. Depending upon the attachment process chosen, the process may require a follow-on cure in a cure oven. Likewise, the attachment process may include placing the dice and cover members 48 on an adhesive comprising an uncured epoxy that has been applied to the die sites. The dice and cover members may be held at a specific pressure by die attachment equipment having a surface contact tool or an edge contact only tool (collet). The dice (and, if necessary depending upon the cover member material, the cover members 48) are pressed down into the adhesive at a specific pressure by the tool and held in place long enough to ensure adhesion.

Adhesive may, alternatively, be applied to the dice and cover members 48 rather than the die sites (or to both the dice and to the die sites). If the cover members 48 comprise a material that does not carry its own adhesive (e.g., if the cover member is not self-adhesive tape) this method (in a single step) applies the required adhesive for the cover members 48 along with adhesive that must be applied to attach the dice. This method may be more efficient for those support elements 42 including cover members 48 that do not comprise self-adhesive materials. If the cover member 48 is self-adhesive, it would not be necessary to apply adhesive to the reject die sites or the cover members 48. Depending upon the materials used, self-adhesive cover members 48 may be used in conjunction with the adhesive used to attach dice. For example, during Step 3, adhesive such as LOC tape may be applied to all die sites (functional and reject sites) and the dice and self-adhesive cover members 48 may then be attached to the LOC tape on the functional and reject die sites, respectively.

According to a fourth method of the present invention, the cover members 48 of support element 42 are attached to reject die sites following a wire bonding process (Step 5 in FIG. 4). The wire bonding process connects the electrical circuitry of the functional substrates 12 to the electrical circuitry of the attached die. Specifically, bond pads of each of the dice are electrically connected to the corresponding die sites on the support element. The wire bond process may be performed using conventional wire bonding methods known to persons skilled in the art.

Fabrication of a semiconductor package 70 (FIG. 3A) utilizing the support element 42 of the present invention (FIGS. 2A and 2B) may then be completed. Specifically, following the wire bond process (Step 5), a polyimide protective layer may be applied to the face of the dice. Next, the support element 42 (including substrates 56 and attached dice 74 or cover members 48) is encapsulted using conventional means and materials as known to persons skilled in the art (Step 6 in FIG. 4). Typically, the dice 74, cover members 48 and substrates 56 of the support element 42 are encapsulated in a suitable plastic material, depending upon the intended use of the semiconductor package being fabricated.

A conventional solder ball attachment process may then be performed and the solder reflowed (Step 7). After the encapsulation and solder ball attach steps, a trim and form operation separates the packages (singulation) and shapes the leads into a desired configuration (Step 8 in FIG. 4). Individual semiconductor packages 70, 72 (as shown in FIGS. 3A and 3B) made utilizing the support element 42 of the present invention are then completed.

With reference to Step 4A in FIG. 4, in yet another method of the present invention, reject die sites 36 may be identified following or during the adhesive application process (Step 3). Dies are then attached to functional die sites and cover members 48 (e.g., reject dies) are attached to reject die sites 36 (Step 4B). The method would then proceed to Steps 5–8, as illustrated in FIG. 4 and discussed above.

Semiconductor packages 70 and 72 illustrated in FIGS. 3A and 3B were made using the support element 42 and methods of the present invention. Semiconductor package 70 illustrated in FIG. 3A is the package resulting from attachment of a functional die to a functional substrate 12 or functional die site 50 of the support element 42. Defective semiconductor package 72 illustrated in FIG. 3B is the package resulting from attachment of a cover member 48 to a reject die site of the support element 42.

Referring to FIGS. 3A and 3B, both the functional and the defective semiconductor packages 70, 72 include the substrate 56 having a planar die attach surface or die site 50 (defective package 72 includes reject die site 36, FIG. 3B). Both semiconductor packages 70, 72 include the features of the support element 42 discussed above. That is, both packages 70, 72 include an opposing conductor surface 76 wherein conductors 47 are formed in a required pattern. Wire bond slots 64 through the substrates 56 provide access for the bonding wires 80. The bonding wires 80 are connected to the conductors 47 and to conductor bond pads (not shown) on the die 74 (FIG. 3A). A glob top 82 is formed over the bonding wires 80 for protection. A solder mask 84 forms vias 86 to the conductors 47 and solder ball bonding pads 90. Solder balls 88 are attached to the conductors 47 through the vias 86.

The functional semiconductor package 70 further includes a die 74 attached to the die site 50 (FIG. 3A). The defective semiconductor package 72 merely includes cover member 48 (that may comprise, for example, a reject die) attached to the reject die site 36. (Thus, little is lost in production of the defective package but significant manufacturing costs are saved by utilizing support elements having functional and defective substrates without sacrificing functional dice or contaminating "adjacent dice," as discussed above). The functional semiconductor package 70 further include adhesive layer 92. (The defective semiconductor package 72 may also includes an adhesive layer if the cover member 48 attached to the substrate 56 was not self-adhesive.) An encapsulating resin 92 encapsulates the die 74 and cover member 48, respectively (FIGS. 3A and 3B).

Whereas the invention has been described with reference to multiple embodiments of the support element 42 and representative methods, it will be understood that the invention is not limited to those embodiments. On the contrary, the invention is intended to encompass all modifications, alternatives, and equivalents as may be included within the spirit and scope of the invention as defined by the appended claims.

We claim:

1. A support element comprising:

(a) a plurality of integrally connected substrates, the substrates forming a first surface and a second surface;

(b) at least one defective substrate forming a defective die attach area on the second surface of the defective substrate;

(c) the at least one defective substrate having a wire bond slot forming an opening through the defective substrate extending from the first surface to the second surface; and (d) a cover member attached to the at least one defective substrate at the defective die attach area so as to cover at least a portion of the wire bond slot, wherein the cover member does not comprise a functional die.

2. The support element of claim 1, wherein the first surface further includes a plurality of conductors.

3. The support member of claim 1, wherein the cover member comprises tape, the tape having dimensions sufficient to cover at least a portion of the wire bond slot.

4. The support member of claim 1, wherein the cover member covers a majority of an opening formed by the wire bond slot.

5. The support element of claim 1, wherein the cover member covers from about 70% to about 98% of the opening formed by the wire bond slot.

6. A support clement comprising:

(a) a strip of insulating material forming a plurality of integrally connected substrates;

(b) a first surface having electrical circuitry at each substrate, wherein there is at least one defective substrate that includes defective electrical circuitry;

(c) a second surface having a substantially planar die attach surface at each substrate; and (d) a cover member placed on the at least one defective substrate having defective electrical circuitry, wherein the cover member covers at least a portion of an opening extending through the defective substrate and does not comprise a functional die.

7. The support member of claim 6, wherein the cover member covers from about 80% to about 90% of the opening.

8. The support element of claim 6, wherein the cover member comprises self-adhesive tape.

9. The support element of claim 6, wherein the cover member comprises a defective die.

10. The support element of claim 6, wherein the cover member covers from about 70% to about 98% of the opening.

11. A support element comprising:
  (a) a plurality of integrally connected substrates, the substrates forming a first surface and a second surface;
  (b) at least one defective substrate forming a defective die attach area on the second surface of the defective substrate;
  (c) the at least one defective substrate having a wire bond slot forming an opening through the defective substrate extending from the first surface to the second surface; and
  (d) a cover member attached to the at least one defective substrate at the defective die attach area so as to cover a majority of the opening formed by the wire bond slot, wherein the cover member does not comprise a functional die.

12. The support element of claim 11, wherein the cover member covers from about 70% to about 98% of the opening formed by the wire bond slot.

13. A support element comprising:
  (a) a plurality of integrally connected substrates, the substrates forming a first surface and a second surface;
  (b) at least one defective substrate forming a defective die attach area on the second surface of the defective substrate;
  (c) the at least one defective substrate having a wire bond slot forming an opening through the defective substrate extending from the first surface to the second surface; and
  (d) a cover member attached to the at least one defective substrate at the defective die attach area so as to cover from about 70 percent to about 100 percent of the opening formed by the wire bond slot, wherein the cover member does not comprise a functional die.

14. The support element of claim 13, wherein the cover member covers from about 70% to about 98% of the opening formed by the wire bond slot.

* * * * *